US006887774B2

(12) United States Patent
Hu et al.

(10) Patent No.: US 6,887,774 B2
(45) Date of Patent: May 3, 2005

(54) CONDUCTOR LAYER NITRIDATION

(75) Inventors: Yongjun Hu, Boise, ID (US); Randhir P.S. Thakur, Boise, ID (US); Scott DeBoer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/881,630

(22) Filed: Jun. 30, 2004

(65) Prior Publication Data

US 2004/0238845 A1 Dec. 2, 2004

Related U.S. Application Data

(60) Continuation of application No. 10/231,758, filed on Aug. 29, 2002, now Pat. No. 6,798,026, which is a continuation of application No. 09/131,993, filed on Aug. 11, 1998, now Pat. No. 6,525,384, which is a division of application No. 08/802,861, filed on Feb. 19, 1997, now Pat. No. 5,926,730.

(51) Int. Cl.[7] .................... H01L 21/3205; H01L 29/76
(52) U.S. Cl. ............... 438/591; 438/592; 438/652; 438/653; 438/761; 438/769; 438/770; 438/775; 438/778; 438/787; 438/791; 257/388; 257/406; 257/410; 257/411; 257/412; 257/639; 257/640
(58) Field of Search .................. 438/591, 592, 438/652, 653, 761, 769, 770, 775, 778, 787, 791; 257/388, 406, 410–412, 639, 640, 649

(56) References Cited

U.S. PATENT DOCUMENTS

| 4,682,407 A | 7/1987 | Wilson et al. ............ 438/517 |
| 4,755,865 A | 7/1988 | Wilson et al. ............ 357/63 |
| 4,774,204 A | 9/1988 | Havemann ............... 437/54 |
| 4,784,973 A | 11/1988 | Stevens et al. ........... 437/200 |
| 4,788,160 A | 11/1988 | Havemann et al. ....... 437/200 |

(Continued)

FOREIGN PATENT DOCUMENTS

EP     0746015     12/1996     ....... H01L/21/3065

OTHER PUBLICATIONS

Beyers, Robert, et al., "Titanium disilicide formation on heavily doped silicon substrates", *Journal of Applied Physics*, vol. 61, No. 11,(Jun. 1, 1987),5110–5117.

Hosoya, Tetsuo, et al., "A Polycide Gate Electrode with a Conductive Diffusion Barrier Formed with ECR Nitrogen Plasma for Dual Gate CMOS", *IEEE Transactions on Electron Devices*, 42, No. 12,(Dec. 1995),pp. 2111–2116.

Ito, Takashi, et al., "A Nitride–Isolated Molybdenum–Polysilicon Gate Electrode for MOS VLSI Circuits", *IEEE Transactions on Electron Devices*, vol. ED–33, No. 4,(Apr. 1986),464–468.

Kobushi, Kazuhiro, et al., "A High Integrity and Low Resistance Ti–Polycide Gate Using a Nitrogen Ion–Implanted Buffer Layer", *Japanese Journal of Applied Physics/Part 2: Letters, 27(11)*, (Nov. 1988),L2158–L2160.

Pan, Paihung, et al., "Highly Conductive Electrodes for CMOS", *Proc. of the international symposium on ULSI Sci & Tech*, ECS, Inc., Pennington, NJ,(1989),104–109.

Shimizu, S., et al., "0.15um CMOS Process for High Performance and High Reliability", *IEEE*, (1994),pp. 4.1.1–4.1.4.

Primary Examiner—George Eckert
Assistant Examiner—Matthew E. Warren
(74) Attorney, Agent, or Firm—Schwegman, Lundberg, Woessner & Kluth, P.A.

(57) ABSTRACT

Methods and apparatus for forming word line stacks comprise forming a thin nitride layer coupled between a bottom silicon layer and a conductor layer. In a further embodiment, a diffusion barrier layer is coupled between the thin nitride layer and the bottom silicon layer. The thin nitride layer is formed by annealing a silicon oxide film in a nitrogen-containing ambient.

114 Claims, 3 Drawing Sheets

U.S. PATENT DOCUMENTS

| | | | |
|---|---|---|---|
| 4,897,368 A | 1/1990 | Kobushi et al. | 437/200 |
| 4,912,542 A | 3/1990 | Suguro | 357/67 |
| 4,923,822 A | 5/1990 | Wang et al. | 437/41 |
| 4,935,804 A | 6/1990 | Ito et al. | 357/71 |
| 5,210,043 A | 5/1993 | Hosaka | 437/30 |
| 5,234,794 A | 8/1993 | Sebald et al. | 430/325 |
| 5,313,087 A | 5/1994 | Chan et al. | 257/538 |
| 5,381,302 A | 1/1995 | Sandhu et al. | 361/305 |
| 5,384,485 A | 1/1995 | Nishida et al. | 257/751 |
| 5,395,787 A | 3/1995 | Lee et al. | 437/57 |
| 5,397,744 A | 3/1995 | Sumi et al. | 437/200 |
| 5,534,713 A | 7/1996 | Ismail et al. | 257/24 |
| 5,541,131 A | 7/1996 | Yoo et al. | 437/44 |
| 5,545,574 A | 8/1996 | Chen et al. | 437/40 |
| 5,545,581 A | 8/1996 | Armacost et al. | 437/52 |
| 5,557,567 A | 9/1996 | Bergemont et al. | 365/185.03 |
| 5,569,947 A | 10/1996 | Iwasa et al. | 257/336 |
| 5,624,869 A | 4/1997 | Agnello et al. | 438/602 |
| 5,633,177 A | 5/1997 | Anjum | 438/301 |
| 5,633,200 A | 5/1997 | Hu | 438/653 |
| 5,637,533 A | 6/1997 | Choi | 438/643 |
| 5,650,648 A | 7/1997 | Kapoor | 257/316 |
| 5,656,546 A | 8/1997 | Chen et al. | 438/586 |
| 5,665,646 A | 9/1997 | Kitano | 438/592 |
| 5,668,394 A | 9/1997 | Lur et al. | 257/413 |
| 5,682,055 A | 10/1997 | Huang et al. | 257/408 |
| 5,710,438 A | 1/1998 | Oda et al. | 257/69 |
| 5,723,893 A | 3/1998 | Yu et al. | 257/413 |
| 5,726,479 A | 3/1998 | Matsumoto et al. | 257/412 |
| 5,728,625 A | 3/1998 | Tung | 438/586 |
| 5,736,455 A | 4/1998 | Iyer et al. | 138/592 |
| 5,739,064 A | 4/1998 | Hu et al. | 438/528 |
| 5,776,815 A | 7/1998 | Pan et al. | 438/396 |
| 5,776,823 A | 7/1998 | Agnello et al. | 438/592 |
| 5,796,151 A | 8/1998 | Hsu et al. | 257/410 |
| 5,856,698 A | 1/1999 | Hu et al. | 257/412 |
| 5,874,351 A | 2/1999 | Hu et al. | 438/527 |
| 5,874,353 A | 2/1999 | Lin et al. | 438/592 |
| 5,925,918 A | 7/1999 | Wu et al. | 257/413 |
| 5,945,719 A | 8/1999 | Tsuda | 257/413 |
| 5,998,290 A | 12/1999 | Wu et al. | 438/595 |
| 6,291,868 B1 | 9/2001 | Weimer et al. | 257/413 |
| 6,362,086 B2 | 3/2002 | Weimer | 438/591 |

CONDUCTOR LAYER NITRIDATION

This application is a Continuation of U.S. application Ser. No. 10/231,758, filed Aug. 29, 2002, U.S. Pat. No. 6,798,026 which is Continuation of U.S. application Ser. No. 09/131,993, filed Aug. 11, 1998, now U.S. Pat. No. 6,525,384, which is a Divisional of U.S. application Ser. No. 08/802,861, filed Feb. 19, 1997, now U.S. Pat. No. 5,926,730, all of which are incorporated herein by reference.

FIELD OF THE INVENTION

The present invention relates to the manufacture of semiconductor devices, and in particular, to the manufacture of gate structures utilized in advanced semiconductor products, having a nitrided conductor layer.

BACKGROUND

Semiconductor memory devices are comprised of an array of memory cells. Each memory cell is comprised of a capacitor, on which the charge stored represents the logical state of the memory cell. A charged capacitor corresponds to a logical state of "1" and an uncharged capacitor corresponds to a logical state of "0." Word lines activate access transistors, so that the logical state of a memory cell can be read. Gates of multiple transistors are formed as one word line.

An example of a word line's application is in a dynamic random access memory (DRAM). In a DRAM, a common word line, used to access memory cells, is fabricated on a p-type silicon substrate coated with a thin film of silicon dioxide ($SiO_2$), known as gate oxide. Then, a word line is formed on the gate oxide layer as a two-layer stack, comprising silicon (or polysilicon), coated with a conductor material. The most common two-layer stack used in the industry is a layer of polysilicon, coated with a tungsten silicide layer. Tungsten silicide is used because of its good integration properties, such as providing good thermal stability, stability during source/drain oxidation, and stability during dry etching, as well as having a low resistivity. Although titanium silicide is approximately 75% less resistive than tungsten silicide, it has not been used extensively in two-layer stacks because it is not as thermally stable. Titanium silicide tends to agglomerate during subsequent high temperature processing steps. Alternatively, a metal is used instead of a silicide for the conductor layer.

Of primary concern is minimizing resistivity throughout the word line, due to the need to reduce RC time constants and access multiple memory cells in as short a period of time as possible. The problem is especially critical due to the extended length of word lines. Diffusion of silicon from the bottom polysilicon layer to the top conductor layer increases the resistivity of the two-layer stack. When silicon diffuses through the stack, it reacts with the conductor layer elements, increasing the resistivity of the conductor layer. When the conductor layer is formed of a metal, silicides are formed, which have a higher resistivity than pure metal.

One previous unsuccessful attempt to solve this diffusion problem introduces a third layer, which acts as a diffusion barrier, between the silicon and conductor layers. For example, a silicon nitride layer is used as the third layer in a two-layer stack. However, the silicon nitride diffusion barrier layer of Ito et al. (IEEE Transactions on Electron Devices, ED-33 (1986), 464 and U.S. Pat. No. 4,935,804) is difficult to employ because it must be ultrathin (less than 3 nanometers thick) to allow tunneling of charges through the layer, yet thick enough to act as a reaction barrier between the polysilicon and conductor layer elements.

Another diffusion barrier used in the past is comprised of a titanium nitride layer interposed between a two-layer stack. The conductive titanium nitride barrier layer of Pan et al. (IBM General Technology Division, "Highly Conductive Electrodes for CMOS") attempts to solve the problems of Ito et al., but it requires a special source/drain (S/D) oxidation process when forming oxide spacers to maintain gate oxide layer integrity. A special process is required due to the tendency for tungsten and titanium nitride to oxidize, resulting in degradation of these layers. This adds time and cost to the fabrication process.

In ultra large scale integrated (ULSI) circuits, a highly conductive word line is necessary to improve circuit density and performance. In order to maintain a highly conductive word line, it is necessary to provide an effective method for decreasing diffusion within the two-layer stack. As devices are scaled down in size, word line widths are also decreased. While smaller line widths result in a decreased amount of resistance, this decrease is more than offset by an increase in resistance due to the longer length of word lines. To date, word line resistance is one of the primary limitations of achieving faster ULSI circuits. A method for decreasing the resistivity of word lines is needed for use in ULSI applications.

In addition to creating a diffusion barrier layer in a two-layer word line stack, another way of decreasing resistance in a word line is by forming a high conductivity film on the word line. Such films are commonly formed of a refractory metal silicide, such as titanium silicide ($TiSi_2$). Titanium is preferably used as the refractory metal component because it has the ability to reduce oxygen, which remains on surfaces in the form of native oxides. Native oxides are reduced to titanium oxide by titanium. Native oxides degrade interface stability, and often cause device failure if not removed.

There is a need to decrease the overall resistivity of a word line stack. One way that this needs to be accomplished is by preventing silicidation at the interface between the bottom silicon layer and the conductor layer in such a stacked structure. While diffusion barrier layers are one attempt to alleviate this problem, additional methods are needed to further decrease the resistivity. One way of preventing silicidation at the interface between the two layers in a word line stack is by forming a thin nitride layer at the interface. Conventionally, this is done by implanting nitrogen at the interface and annealing. However, implantation is not a preferred way of forming such layers, particularly in shallow junctions.

SUMMARY OF THE INVENTION

A method for forming a word line, which is used in ultra-large scale integrated (ULSI) circuits, produces lower resistivity word lines than those formed using prior art techniques. In one embodiment of the invention, a thin nitride layer is formed at the interface between a bottom silicon layer and a conductor layer in a word line stack. The nitride layer improves high temperature stability of the conductor layer. Thermal stability of the conductor layer is improved because the nitride layer inhibits uncontrollable, massive silicidation, which results from pin holes, or other defect sites at the interface between the conductor layer and the bottom silicon layer. Furthermore, leakage currents are reduced due to the nitride layer. Using the method of the invention for nitriding the conductor layer/bottom silicon layer interface is preferable to using prior art methods of implanting nitrogen at the interface. Implanted nitrogen is plagued by straggle, which causes problems in shallow junction applications.

DETAILED DESCRIPTION

Figure 1A:
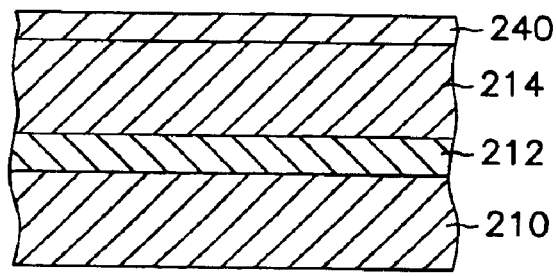
FIGS. 1A–1G are cross-sectional representations of a method for forming a word line stack in accordance with the method of the invention, having a nitrided conductor layer.

A method of lightly nitriding the $TiSi_2$/Si (or polysilicon) interface through "thin snow-plow" metallization improves high temperature stability of $TiSi_2$. As illustrated in FIG. 1A, an ultrathin (approximately between 20 to 30 angstroms) $SiO_2$ film 240 is grown on the bottom silicon layer 214 of a word line stack, formed over a silicon substrate 210 and gate oxide 212, using rapid thermal oxidation (RTO) processing. For example, using RTO, a thin oxide is grown using an Applied Materials Centura HT (G2) tool in RTO mode. Oxygen is introduced at a pressure of approximately 50 Torr and temperature of approximately 800 to 1,050 degrees Celsius. After approximately 15 to 25 seconds, a 20 to 30 angstrom oxide film 240 is formed. The RTO temperature is reduced if RTO time is increased. These parameters are not meant to be limiting, but are only one way to grow an ultrathin oxide film 240.

Figure 1B:
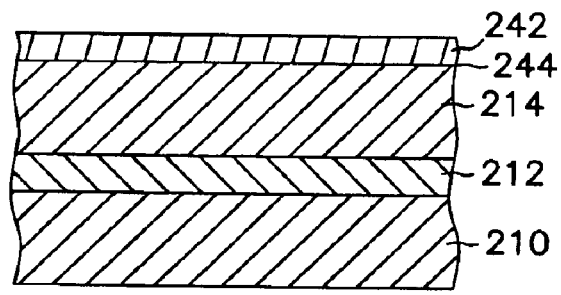

Then, the film 240 is annealed in an $N_2O$, $NH_3$, or NO, ambient, using rapid thermal nitridation (RTN) or plasma nitridation, resulting in a thin film 242, having an increased nitrogen concentration, as shown in FIG. 1B, and a thickness between approximately 20 and 50 angstroms. The nitrogen-containing ambient effectively strengthens thin spots and fills any pin holes, improving uniformity of the oxide film 242. Pin holes, or interface defect sites, are usually sources of uncontrollable, massive silicidation that lead to nonuniform growth of $TiSi_2$. Nonuniform growth of $TiSi_2$ results in an undesirable, higher resistivity silicide film.

The key to obtaining a low resistivity $TiSi_2$ film using this approach, is to have a flat, thin "snow-plow," as described below. A "snow plow" starts with a nitrogen-doped silicon oxide film 242 (approximately less than 20 to 50 angstroms), having a low nitrogen concentration (approximately $10^{13}$ ions/cm$^2$) primarily at the $SiO_2$/Si (or polysilicon) interface 244, as shown in FIG. 1B. When the RTN step is performed at a temperature of approximately 800 to 1,050 degrees Celsius, the concentration of nitrogen atoms at the $SiO_2$/Si interface 244 is approximately 1.4% N atoms by volume when using a $N_2O$ ambient and approximately 5.4% N atoms by volume when using a NO ambient. The nitrogen concentration in the film 242 can be determined by a film reflex index. A lower nitrogen content is obtained by varying the annealing temperature and ambient gas used. A higher nitrogen content is achievable by annealing in an ammonia, $NH_3$ ambient. However, usually only a very low nitrogen concentration is needed at the $SiO_2$/Si interface 244 because too much nitrogen content can inhibit subsequent silicidation.

Figure 1C:
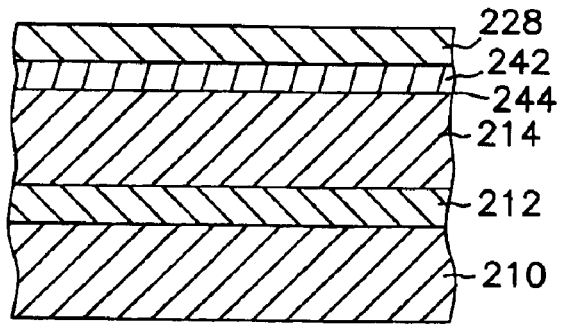
Figure 1D:
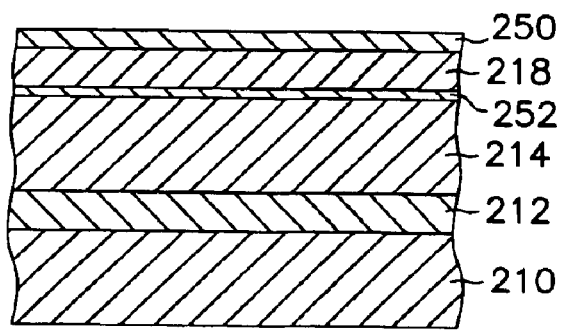

Subsequently, a $TiSi_2$ film is grown by depositing a titanium layer 228, as shown in FIG. 1C, onto the exposed side of the nitrogen-containing $SiO_2$ film 242 and annealing. The thickness of the titanium layer 228 depends on the application, but is typically approximately 400 to 1,500 angstroms. During $TiSi_2$ growth, titanium 228 reduces the oxygen contained in the $SiO_xN_y$ layer 242. As $TiSi_2$ 218 is formed, and the $TiSi_2$ 218 boundary advances, reduced oxygen atoms 250 (i.e., $TiO_x$) are "snow-plowed" towards an outer $TiSi_2$ 218 surface due to more favorable $TiSi_2$ 218 formation, as shown in FIG. 1D. The thickness of the titanium oxide layer 250 formed is not critical, because it is later stripped away, but is typically approximately 5% of the thickness of the titanium silicide layer 218 formed. The "thin snow-plow" phenomenon produces a high quality $TiSi_2$ film 218. The titanium silicide film 218 is approximately 400 to 3,000 angstroms thick. In general, it is typically approximately 2 to 3 times the thickness of the original layer of deposited titanium 228. Only a light nitride layer 252 remains at the $TiSi_2$/Si (or polysilicon) interface, having a thickness of approximately a few atomic layers.

Thermal stability of $TiSi_2$ 218 is greatly improved by forming a light nitride layer 252 in accordance with this embodiment of the invention, as shown in FIG. 1D. Word lines formed in accordance with this method are thermally stable, up to 200 to 300 degrees Celsius more so than those formed using prior art techniques. However, there is a trade off for improving the thermal stability of a word line using a thin nitride layer 252. The nitride layer 252 increases the resistivity of the word line. However, resistivity of the resulting conductor layer 218 is usually no more than a factor of two larger than conventional silicided $TiSi_2$. Furthermore, this method effectively lowers leakage currents. This method is highly advantageous over implanting nitrogen into the silicon substrate to form a nitride layer. Since nitrogen is a light element, projected straggle during implantation is quite large, even at shallow implantations (i.e., approximately 200 angstroms for a 20 keV implant). Light nitridation using implantation occurs at least in a range of several hundred angstroms. This potentially causes problems for future shallow junction applications.

Figure 1E:
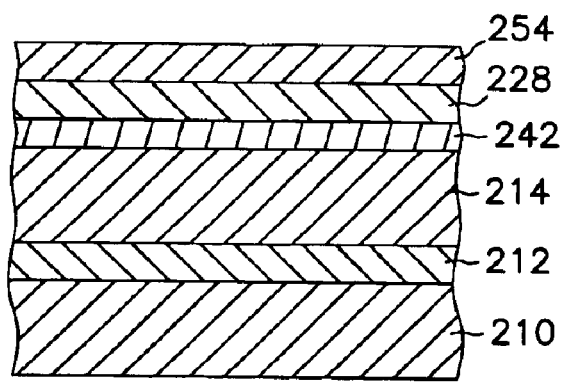
Figure 1F:
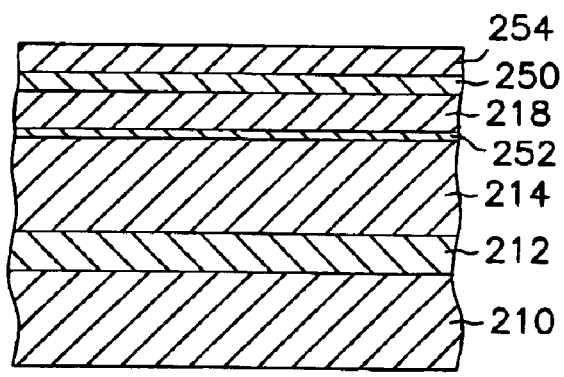
Figure 1G:
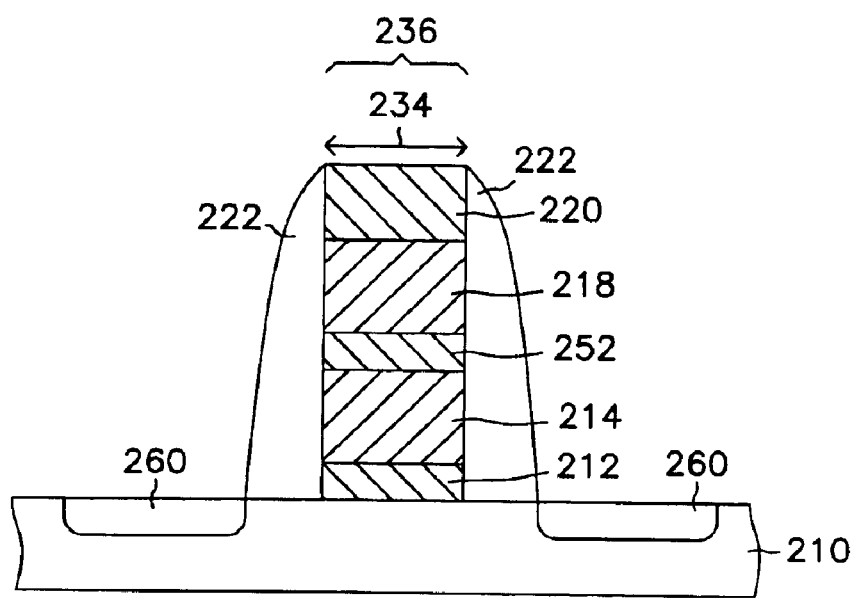

In a further embodiment, subsequent to deposition of titanium 228 and prior to annealing to form $TiSi_2$ 218, a titanium nitride (TiN) cap 254 is formed, as shown in FIG. 1E. Such a layer 254 is typically approximately 25 nanometers thick, deposited using physical vapor deposition (PVD). As the $TiSi_2$ 218 boundary advances, reduced oxygen atoms 250 (i.e., $TiO_x$) are "snow-plowed" towards the outer $TiSi_2$ 218 surface due to more favorable $TiSi_2$ 218 formation, as shown in FIG. 1F. This "thin snow-plow" phenomenon produces a high quality $TiSi_2$ film 218. Only a light nitridation layer 252 remains at the $TiSi_2$/Si (or polysilicon) interface. The TiN cap 254 remains interposed on the outside surface of the word line stack. The TiN cap 254 and the $TiO_x$ layer 250 can then be stripped away with a suitable acid. Subsequent process steps comprise depositing a cap dielectric 220, such as silicon oxide or silicon nitride, and etching to define a word line stack 236 and forming oxide spacers 222 alongside the word line stack 236, as shown in FIG. 1G. The line width 234 of a word line is equal to the width 234 of the word line stack 236. Conventional source/drain implantation forms implanted regions 260 self-aligned with the oxide spacers 222.

In still further embodiments of the invention, a nitride layer is formed on a second diffusion barrier layer interposed between the bottom silicon layer and the conductor layer in a word line stack. Such diffusion barrier layers are well known to one skilled in the art. Further variations will be apparent to one skilled in the art.

We claim:
1. A method for forming a semiconductor transistor structure, comprising:
   forming a semiconductor substrate;
   coupling a gate oxide layer to the semiconductor substrate;
   coupling a bottom silicon layer to the gate oxide layer;
   positioning a conductor layer adjacent to the bottom silicon layer;
   interposing a thin, nitride layer having a low nitrogen concentration of approximately $10^{13}$ ions/cm$^3$ between the bottom silicon layer and the conductor layer, wherein interposing the nitride layer includes interpos- ing the nitride layer having a thickness of a few atomic layers so as not to inhibit subsequent silicidation.

2. The method of claim 1, wherein interposing the nitride layer includes interposing the nitride layer having a thickness of approximately less than 20 to 50 angstroms.

3. The method of claim 1, wherein interposing the nitride layer includes interposing the nitride layer having a low nitrogen concentration of approximately 1.4 percent by volume of nitrogen atoms.

4. The method of claim 1, wherein interposing the nitride layer includes interposing the nitride layer having a low nitrogen concentration of approximately 5.4 percent by volume of nitrogen atoms.

5. A method for forming a semiconductor memory device, comprising:
   forming a plurality of memory cells;
   coupling a plurality of access transistors to the plurality of memory cells; and
   coupling at least one word line formed over a gate oxide layer to the plurality of access transistors by a method comprising:
      forming a bottom silicon layer over the gate oxide layer;
      forming a nitrogen-doped silicon oxide layer over the bottom silicon layer;
      forming a refractory metal layer on the nitrogen-doped silicon oxide layer; and
      annealing the refractory metal layer to form a refractory metal silicide conductor layer and a thin, nitride layer having a low nitrogen concentration of approximately $10^{13}$ ions/cm$^3$ interposed between the bottom silicon layer and the refractory metal silicide conductor layer, wherein annealing the refractory metal layer to form the nitride layer includes annealing the refractory metal layer to form the nitride layer having a thickness of a few atomic layers, and wherein forming the nitrogen-doped silicon oxide layer includes forming nitrogen in the nitrogen-doped silicon oxide layer that does not inhibit silicidation.

6. The method of claim 5, wherein annealing the refractory metal layer to form the nitride layer includes annealing the refractory metal layer to form the nitride layer having a thickness of approximately less than 20 to 50 angstroms.

7. The method of claim 5, wherein forming the bottom silicon layer comprises selecting a material selected from the group consisting of intrinsic silicon, intrinsic polysilicon, doped silicon, and doped polysilicon.

8. The method of claim 5, wherein annealing the refractory metal layer to form the refractory metal silicide conductor layer concurrently forms the nitride layer interposed between the bottom silicon layer and the refractory metal silicide conductor layer.

9. The method of claim 5, wherein annealing the refractory metal layer to form the nitride layer includes annealing the refractory metal layer to form the nitride layer having a low nitrogen concentration of approximately 1.4 percent by volume of nitrogen atoms.

10. The method of claim 5, wherein annealing the refractory metal layer to form the nitride layer includes annealing the refractory metal layer to form the nitride layer having a low nitrogen concentration of approximately 5.4 percent by volume of nitrogen atoms.

11. A method of forming a semiconductor memory device, comprising:
   forming a plurality of memory cells;
   coupling a plurality of access transistors to the plurality of memory cells; and
   coupling at least one word line formed over a gate oxide layer to the plurality of access transistors by a method comprising:
      forming a bottom silicon layer over the gate oxide layer;
      forming a silicon oxide layer over the bottom silicon layer;
      annealing the silicon oxide layer in a nitrogen-containing ambient to form a nitrogen-doped silicon oxide layer, wherein annealing the silicon oxide layer in the nitrogen-containing ambient to form the nitrogen-doped silicon oxide layer includes forming the nitrogen-doped silicon oxide layer doped with nitrogen so as not to inhibit subsequent silicidation;
      forming a titanium layer on the nitrogen-doped silicon oxide layer; and
      annealing the titanium layer to form a titanium silicide conductor layer and a thin, silicon nitride layer having a low nitrogen concentration of approximately $10^{13}$ ions/cm$^3$ interposed between the bottom silicon layer and a refractory metal silicide conductor layer, wherein annealing the titanium layer to form the silicon nitride layer includes annealing the titanium layer to form the silicon nitride layer having a thickness of a few atomic layers.

12. The method of claim 11, wherein annealing the titanium layer to form the silicon nitride layer includes annealing the titanium layer to form the silicon nitride layer having a low nitrogen concentration of approximately 1.4 percent by volume of nitrogen atoms.

13. The method of claim 11, wherein annealing the titanium layer to form the silicon nitride layer includes annealing the titanium layer to form the silicon nitride layer having a low nitrogen concentration of approximately 5.4 percent by volume of nitrogen atoms.

14. The method of claim 11, wherein annealing the titanium layer to form the titanium silicide conductor layer concurrently forms the silicon nitride layer interposed between the bottom silicon layer and the titanium silicide conductor layer.

15. The method of claim 11, wherein annealing the titanium layer to form the silicon nitride layer includes annealing the titanium layer to form the silicon nitride layer having a thickness of approximately less than 20 to 50 angstroms.

16. A method of forming a semiconductor memory device, comprising:
   forming a plurality of memory cells;
   coupling a plurality of access transistors to the plurality of memory cells; and
   coupling at least one word line formed over a gate oxide layer to the plurality of access transistors by a method comprising:
      forming a bottom silicon layer over the gate oxide layer;
      forming a silicon oxide layer over the bottom silicon layer;
      annealing the silicon oxide layer in a nitrogen-containing ambient to form a nitrogen-doped silicon oxide layer, wherein annealing the silicon oxide layer in the nitrogen-containing ambient to form the nitrogen-doped silicon oxide layer includes forming the nitrogen-doped silicon oxide layer doped with nitrogen so as not to inhibit subsequent silicidation;
      forming a titanium layer on the nitrogen-doped silicon oxide layer;
      annealing the titanium layer to form a titanium silicide conductor layer and a thin, silicon nitride layer having a low nitrogen concentration of approximately $10^{13}$ ions/cm$^3$ interposed between the bottom silicon layer and a refractory metal silicide conductor layer, wherein annealing the titanium layer to form the silicon nitride layer includes annealing the titanium layer to form the silicon nitride layer having a thickness of a few atomic layers;

forming a cap dielectric over the titanium silicide conductor layer;

etching each layer to define a word line stack; and forming spacers alongside the word line stack.

17. The method of claim 16, wherein annealing the titanium layer to form the silicon nitride layer includes annealing the titanium layer to form the silicon nitride layer having a thickness of approximately less than 20 to 50 angstroms.

18. The method of claim 16, wherein annealing the titanium layer to form the silicon nitride layer includes annealing the titanium layer to form the silicon nitride layer having a low nitrogen concentration of approximately 1.4 percent by volume of nitrogen atoms.

19. The method of claim 16, wherein annealing the titanium layer to form the silicon nitride layer includes annealing the titanium layer to form the silicon nitride layer having a low nitrogen concentration of approximately 5.4 percent by volume of nitrogen atoms.

20. A method of forming a semiconductor memory device, comprising:

forming a plurality of memory cells;

coupling a plurality of access transistors to the plurality of memory cells;

coupling at least one word line formed over a gate oxide layer to the plurality of access transistors by a method comprising:

forming a bottom silicon layer over the gate oxide layer;

forming a nitrogen-doped silicon oxide layer over the bottom silicon layer;

forming a titanium layer on the nitrogen-doped silicon oxide layer; and forming a titanium nitride cap over the titanium layer; and annealing the titanium layer, after forming the titanium nitride cap, to form a titanium silicide conductor layer and a thin, silicon nitride layer having a low nitrogen concentration of approximately $10^{13}$ ions/cm$^3$ from the nitrogen-doped silicon oxide layer and the titanium layer, wherein annealing the titanium layer to form the silicon nitride layer includes annealing the titanium layer to form the silicon nitride layer having a thickness of a few atomic layers interposed between the bottom silicon layer and the titanium silicide conductor layer.

21. The method claim 20, wherein annealing the titanium layer to form the silicon nitride layer includes annealing the titanium layer to form the silicon nitride layer having a thickness of approximately less than 20 to 50 angstroms.

22. The method of claim 20, wherein annealing the titanium layer to form the silicon nitride layer includes annealing the titanium layer to form the silicon nitride layer having a low nitrogen concentration of approximately 1.4 percent by volume of nitrogen atoms.

23. The method of claim 20, wherein annealing the titanium layer to form the silicon nitride layer includes annealing the titanium layer to form the silicon nitride layer having a low nitrogen concentration of approximately 5.4 percent by volume of nitrogen atoms.

24. A method of forming a semiconductor memory device, comprising:

forming a plurality of memory cells;

coupling a plurality of access transistors to the plurality of memory cells; and coupling at least one word line to the plurality of access transistors, wherein the at least one word line comprises:

coupling a bottom silicon layer to a gate oxide layer;

coupling a thin, nitride layer to the bottom silicon layer; and coupling a refractory metal silicide layer produced from a reaction of the refractory metal layer and a nitrogen-doped silicon oxide layer to the nitride layer having a low nitrogen concentration of approximately $10^{13}$ ions/cm$^3$, wherein coupling the refractory metal silicide layer to the nitride layer includes coupling the refractory metal silicide layer to the nitride layer having a residual of the nitrogen-doped silicon oxide layer after the reaction with the refractory metal layer, and wherein coupling the refractory metal silicide layer to the nitride layer includes coupling the refractory metal silicide layer to the nitride layer having a thickness of a few atomic layers and increases resistance of the at least one word line by a factor of not more than two.

25. The method of claim 24, wherein coupling the refractory metal silicide layer to the nitride layer includes coupling the refractory metal silicide layer to the nitride layer having a thickness of approximately less than 20 to 50 angstroms.

26. The method of claim 24, wherein coupling the refractory metal silicide layer to the nitride layer includes coupling the refractory metal silicide layer to the nitride layer having a low nitrogen concentration of approximately 1.4 percent by volume of nitrogen atoms.

27. The method of claim 24, wherein coupling the refractory metal silicide layer to the nitride layer includes coupling the refractory metal silicide layer to the nitride layer having a low nitrogen concentration of approximately 5.4 percent by volume of nitrogen atoms.

28. A method of forming a semiconductor memory device, comprising:

forming a plurality of memory cells;

coupling a plurality of access transistors to the plurality of memory cells; and coupling at least one word line to the plurality of access transistors, wherein the at least one word line comprises:

coupling a bottom silicon layer to a gate oxide layer;

forming a refractory metal silicide layer produced from a reaction of a refractory metal layer and a nitrogen-doped silicon oxide layer; and interposing a silicon nitride layer having a low nitrogen concentration of approximately $10^{13}$ ions/cm$^3$ between the refractory metal silicide layer and the bottom silicon layer, wherein interposing the silicon nitride layer includes interposing the silicon nitride layer having a residual of the nitrogen-doped silicon oxide layer after the reaction with the refractory metal layer, and wherein interposing the silicon nitride layer includes interposing the silicon nitride layer having a thickness of a few atomic layers and increases resistance of the at least one word line by a factor of not more than two.

29. The method of claim 28, wherein interposing the silicon nitride layer includes interposing the silicon nitride layer having a thickness of approximately less than 20 to 50 angstroms.

30. The method of claim 28, wherein interposing the silicon nitride layer includes interposing the silicon nitride layer having a low nitrogen concentration of approximately 1.4 percent by volume of nitrogen atoms.

31. The method of claim 28, wherein interposing the silicon nitride layer includes interposing the silicon nitride layer having a low nitrogen concentration of approximately 5.4 percent by volume of nitrogen atoms.

32. A method of forming a semiconductor transistor structure, comprising:

forming a substrate;

coupling a gate oxide layer to the substrate;

coupling a bottom silicon layer to the gate oxide layer;

coupling a silicon nitride layer to the bottom silicon layer; and coupling a refractory metal silicide layer produced from a reaction of a refractory metal layer and a nitrogen-doped silicon oxide layer to the silicon nitride layer having a low nitrogen concentration of approximately $10^{13}$ ions/cm$^3$, wherein coupling the refractory metal silicide layer to the silicon nitride layer includes coupling the refractory metal silicide layer to the silicon nitride layer having a residual of the nitrogen-doped silicon oxide layer after the reaction with the refractory metal layer, and wherein coupling the refractory metal silicide layer to the silicon nitride layer includes coupling the refractory metal silicide layer to the silicon nitride layer having a thickness of a few atomic layers and increases a resistance of the structure by a factor of not more than two.

33. The method of claim 32, wherein coupling the refractory metal silicide layer to the silicon nitride layer includes coupling the refractory metal silicide layer to the silicon nitride layer having a thickness of approximately less than 20 to 50 angstroms.

34. The method of claim 32, wherein coupling the refractory metal silicide layer to the silicon nitride layer includes coupling the refractory metal silicide layer to the silicon nitride layer having a low nitrogen concentration of approximately 1.4 percent by volume of nitrogen atoms.

35. The method of claim 32, wherein coupling the refractory metal silicide layer to the silicon nitride layer includes coupling the refractory metal silicide layer to the silicon nitride layer having a low nitrogen concentration of approximately 5.4 percent by volume of nitrogen atoms.

36. A method of forming a semiconductor transistor structure, comprising:

forming a substrate;

coupling a gate oxide layer to the substrate;

coupling a bottom silicon layer to the gate oxide layer;

coupling a nitride layer to the bottom silicon layer;

coupling a refractory metal silicide layer produced from a reaction of a refractory metal layer and a nitrogen-doped silicon oxide layer to the nitride layer having a low nitrogen concentration of approximately $10^{13}$ ions/cm$^3$, wherein coupling the refractory metal silicide layer to the nitride layer includes coupling the refractory metal silicide layer to the nitride layer having a residual of the nitrogen-doped silicon oxide layer after the reaction with the refractory metal layer, and wherein coupling the refractory metal silicide layer to the nitride layer includes coupling the refractory metal silicide layer to the nitride layer having a thickness of a few atomic layers and increases a resistance of the structure by a factor of not more than two;

coupling a dielectric layer to the refractory metal silicide layer; stacking the gate oxide layer, the bottom silicon layer, the nitride layer, the refractory metal silicide layer and the dielectric layer;

coupling at least one oxide spacer alongside the stack; and forming two source/drain regions in the substrate and adjacent the at least one oxide spacer.

37. The method of claim 36, wherein coupling the refractory metal silicide layer to the nitride layer includes coupling the refractory metal silicide layer to the nitride layer having a thickness of approximately less than 20 to 50 angstroms.

38. The method of claim 36, wherein coupling the refractory metal silicide layer to the nitride layer includes coupling the refractory metal silicide layer to the nitride layer having a low nitrogen concentration of approximately 1.4 percent by volume of nitrogen atoms.

39. The method of claim 36, wherein coupling the refractory metal silicide layer to the nitride layer includes coupling the refractory metal silicide layer to the nitride layer having a low nitrogen concentration of approximately 5.4 percent by volume of nitrogen atoms.

40. A method of forming a semiconductor transistor structure, comprising:

forming a substrate;

coupling a gate oxide layer to the substrate;

coupling a bottom silicon layer to the gate oxide layer;

forming a refractory metal silicide layer, wherein forming the refractory metal silicide layer includes forming the refractory metal silicide layer having a reaction of a refractory metal layer and a nitrogen-doped silicon oxide layer; and interposing a nitride layer having a low nitrogen concentration of approximately $10^{13}$ ions/cm$^3$ between the refractory metal silicide layer and the bottom silicon layer, wherein interposing the nitride layer includes interposing the nitride layer having a residual of the nitrogen-doped silicon oxide layer after the reaction with the refractory metal layer and a thickness of a few atomic layers.

41. The method of claim 40, wherein interposing the nitride layer includes interposing the nitride layer having a thickness of approximately less than 20 to 50 angstroms.

42. The method of claim 40, wherein interposing the nitride layer includes interposing the nitride layer having a low nitrogen concentration of approximately 1.4 percent by volume of nitrogen atoms.

43. The method of claim 40, wherein interposing the nitride layer includes interposing the nitride layer having a low nitrogen concentration of approximately 5.4 percent by volume of nitrogen atoms.

44. A method of forming a semiconductor transistor structure, comprising:

forming a substrate;

coupling a gate oxide layer coupled to the substrate;

coupling a bottom silicon layer coupled to the gate oxide layer;

coupling a refractory metal silicide layer, wherein coupling the refractory metal silicide layer includes coupling the refractory metal silicide layer produced from a reaction of a refractory metal layer and a nitrogen-doped silicon oxide layer;

interposing a silicon nitride layer having a low nitrogen concentration of approximately $10^{13}$ ions/cm$^3$ between the refractory metal silicide layer and the bottom silicon layer, wherein interposing the silicon nitride layer includes interposing the silicon nitride layer having a residual of the nitrogen-doped silicon oxide layer after the reaction with the refractory metal layer, and wherein interposing the silicon nitride layer includes interposing the silicon nitride layer having a thickness of a few atomic layers and increases a resistance of the structure by a factor of not more than two;

coupling a dielectric layer to the refractory metal silicide layer; stacking the gate oxide layer, the bottom silicon layer, the nitride layer, the refractory metal silicide layer and the dielectric layer;

coupling at least one oxide spacer alongside the stack; and forming two source/drain regions in the substrate and adjacent the at least one oxide spacer.

45. The method of claim 44, wherein interposing the silicon nitride layer includes interposing the silicon nitride layer having a thickness of approximately less than 20 to 50 angstroms.

46. The method of claim 44 wherein interposing the silicon nitride layer includes interposing the silicon nitride layer having the low nitrogen concentration of approximately 1.4 percent by volume of nitrogen atoms.

47. The method of claim 44, wherein interposing the silicon nitride layer includes interposing the silicon nitride layer having a low nitrogen concentration of approximately 5.4 percent by volume of nitrogen atoms.

48. A method of forming a semiconductor transistor structure, comprising:

forming a semiconductor substrate;

coupling a gate oxide layer to the semiconductor substrate;

coupling a bottom silicon layer to the gate oxide layer;

introducing a conductor layer adjacent to the bottom silicon layer; and interposing a thin, nitride layer having a thickness of a few atomic layers between the bottom silicon layer and the conductor layer so as not inhibit subsequent silicidation, and wherein interposing the nitride layer includes interposing the nitride layer having a low nitrogen concentration of approximately 1.4 percent by volume of nitrogen atoms.

49. The method of claim 48, wherein interposing the nitride layer includes interposing the nitride layer having a thickness of approximately less than 20 to 50 angstroms.

50. The method of claim 48, wherein coupling the bottom silicon layer comprises selecting a material selected from the group consisting of intrinsic silicon, intrinsic polysilicon, doped silicon, and doped polysilicon.

51. A method of forming a semiconductor transistor structure, comprising:

forming a semiconductor substrate;

coupling a gate oxide layer to the semiconductor substrate;

coupling a bottom silicon layer to the gate oxide layer;

introducing a conductor layer adjacent to the bottom silicon layer; and interposing a thin, nitride layer having a thickness of a few atomic layers between the bottom silicon layer and the conductor layer such as not to inhibit subsequent silicidation, wherein interposing the nitride layer includes interposing the nitride layer having a low nitrogen concentration of approximately 5.4 percent by volume of nitrogen atoms.

52. The method of claim 51, wherein interposing the nitride layer includes interposing the nitride layer having a thickness of approximately less than 20 to 50 angstroms.

53. The method of claim 51, wherein coupling the bottom silicon layer comprises selecting a material selected from the group consisting of intrinsic silicon, intrinsic polysilicon, doped silicon, and doped polysilicon.

54. A method of forming a semiconductor memory device, comprising:

forming a plurality of memory cells;

coupling a plurality of access transistors to the plurality of memory cells; and coupling at least one word line formed over a gate oxide layer to the plurality of access transistors by a method comprising:

forming a bottom silicon layer over the gate oxide layer;

forming a nitrogen-doped silicon oxide layer over the bottom silicon layer;

forming a refractory metal layer on the nitrogen-doped silicon oxide layer; and annealing the refractory metal layer to form a refractory metal silicide conductor layer and a thin, nitride layer having a thickness of a few atomic layers interposed between the bottom silicon layer and the refractory metal silicide conductor layer, wherein during annealing of the refractory metal layer the nitrogen in the nitrogen-doped silicon oxide layer does not inhibit silicidation, and wherein annealing the refractory metal layer to form the nitride layer includes annealing the refractory metal layer to form the nitride layer having a low nitrogen concentration of approximately 1.4 percent by volume of nitrogen atoms.

55. The method of claim 54, wherein forming the bottom silicon layer comprises selecting a material selected from the group consisting of intrinsic silicon, intrinsic polysilicon, doped silicon, and doped polysilicon.

56. The method of claim 54, wherein annealing the refractory metal layer to form a refractory metal silicide conductor layer concurrently forms the nitride layer interposed between the bottom silicon layer and the refractory metal silicide conductor layer.

57. A method of forming a semiconductor memory device, comprising:

forming a plurality of memory cells;

coupling a plurality of access transistors to the plurality of memory cells; and coupling at least one word line formed over a gate oxide layer to the plurality of access transistors by a method comprising:

forming a bottom silicon layer over the gate oxide layer;

forming a nitrogen-doped silicon oxide layer over the bottom silicon layer;

forming a refractory metal layer on the nitrogen-doped silicon oxide layer; and annealing the refractory metal layer to form a refractory metal silicide conductor layer and a thin, nitride layer having a thickness of a few atomic layers interposed between the bottom silicon layer and the refractory metal silicide conductor layer, wherein during annealing of the refractory metal layer the nitrogen in the nitrogen-doped silicon oxide layer does not inhibit silicidation, and wherein annealing the refractory metal layer to form the nitride layer includes annealing the refractory metal layer to form the nitride layer having a low nitrogen concentration of approximately 5.4 percent by volume of nitrogen atoms.

58. The method of claim 57, wherein annealing the refractory metal layer to form the refractory metal silicide conductor layer concurrently forms the nitride layer interposed between the bottom silicon layer and the refractory metal silicide conductor layer.

59. The method of claim 57, wherein annealing the refractory metal layer to form the nitride layer includes annealing the refractory metal layer to form the nitride layer having a thickness of approximately less than 20 to 50 angstroms.

60. A method of forming a semiconductor memory device, comprising:

forming a plurality of memory cells;

coupling a plurality of access transistors to the plurality of memory cells; and coupling at least one word line formed over a gate oxide layer to the plurality of access transistors by a method comprising:

forming a bottom silicon layer over the gate oxide layer;

forming a silicon oxide layer over the bottom silicon layer;

annealing the silicon oxide layer in a nitrogen-containing ambient to form a nitrogen-doped silicon oxide layer, wherein forming the nitrogen-doped silicon oxide layer includes forming the nitrogen-doped silicon oxide layer with nitrogen so as not to inhibit subsequent silicidation;

forming a titanium layer on the nitrogen-doped silicon oxide layer; and annealing the titanium layer to form a titanium silicide conductor layer and a thin, silicon nitride layer having a thickness of a few atomic layers interposed between the bottom silicon layer and a refractory metal silicide conductor layer; wherein annealing the titanium layer to form the silicon nitride layer includes annealing the titanium layer to form the silicon nitride layer having a low nitrogen concentration of approximately 1.4 percent by volume of nitrogen atoms.

61. The method of claim 60, wherein annealing the titanium layer to form a titanium silicide conductor layer concurrently forms the silicon nitride layer interposed between the bottom silicon layer and the titanium silicide conductor layer.

62. The method of claim 60, wherein annealing the titanium layer to form the silicon nitride layer includes annealing the titanium layer to form the silicon nitride layer having a thickness of approximately less than 20 to 50 angstroms.

63. A method of forming a semiconductor memory device, comprising:

forming a plurality of memory cells;

coupling a plurality of access transistors to the plurality of memory cells; and coupling at least one word line formed over a gate oxide layer to the plurality of access transistors by a method comprising:

forming a bottom silicon layer over the gate oxide layer;

forming a silicon oxide layer over the bottom silicon layer;

annealing the silicon oxide layer in a nitrogen-containing ambient to form a nitrogen-doped silicon oxide layer, wherein forming the nitrogen-doped silicon oxide layer includes forming the nitrogen-doped silicon oxide layer that is doped with nitrogen so as not to inhibit subsequent silicidation;

forming a titanium layer on the nitrogen-doped silicon oxide layer; and annealing the titanium layer to form a titanium silicide conductor layer and a thin, silicon nitride layer having a thickness of a few atomic layers interposed between the bottom silicon layer and a refractory metal silicide conductor layer, wherein annealing the titanium layer to form the silicon nitride layer includes annealing the titanium layer to form the silicon nitride layer having a low nitrogen concentration of approximately 5.4 percent by volume of nitrogen atoms.

64. The method of claim 63, wherein forming the bottom silicon layer comprises selecting a material selected from the group consisting of intrinsic silicon, intrinsic polysilicon, doped silicon, and doped polysilicon.

65. The method of claim 63, wherein annealing the silicon oxide layer in the nitrogen-containing ambient includes selecting a nitrogen-containing ambient from at least one material selected from the group consisting of $N_2O$, NO and $NH_3$.

66. A method of forming a semiconductor memory device, comprising:

forming a plurality of memory cells;

coupling a plurality of access transistors to the plurality of memory cells; and coupling at least one word line over a gate oxide layer to the plurality of access transistors by a method comprising:

forming a bottom silicon layer over the gate oxide layer;

forming a silicon oxide layer over the bottom silicon layer;

annealing the silicon oxide layer in a nitrogen-containing ambient to form a nitrogen-doped silicon oxide layer, wherein annealing the silicon oxide layer in the nitrogen-containing ambient includes doping the nitrogen-containing ambient with nitrogen so as not to inhibit subsequent silicidation;

forming a titanium layer on the nitrogen-doped silicon oxide layer;

annealing the titanium layer to form a titanium silicide conductor layer and a thin, silicon nitride layer having a thickness of a few atomic layers interposed between the bottom silicon layer and a refractory metal silicide conductor layer, wherein annealing the titanium layer to form the silicon nitride layer includes annealing the titanium layer to form the silicon nitride layer having a low nitrogen concentration of approximately 1.4 percent by volume of nitrogen atoms;

forming a cap dielectric over the titanium silicide conductor layer;

etching each layer to define a word line stack; and forming spacers alongside the word line stack.

67. The method of claim 66, wherein annealing the titanium layer to form the titanium silicide conductor layer concurrently forms the silicon nitride layer interposed between the bottom silicon layer and the titanium silicide conductor layer.

68. The method of claim 66, wherein annealing the titanium layer to form the silicon nitride layer includes annealing the titanium layer to form the silicon nitride layer having a thickness of approximately less than 20 to 50 angstroms.

69. A method of forming a semiconductor memory device, comprising:

forming a plurality of memory cells;

coupling a plurality of access transistors to the plurality of memory cells; and coupling at least one word line to the plurality of access transistors, wherein the at least one word line is formed over a gate oxide layer by a method comprising:

forming a bottom silicon layer over the gate oxide layer;
forming a silicon oxide layer over the bottom silicon layer;
annealing the silicon oxide layer in a nitrogen-containing ambient to form a nitrogen-doped silicon oxide layer, wherein annealing the silicon oxide layer in the nitrogen-containing ambient to form the nitrogen-doped silicon oxide layer includes forming the nitrogen-doped silicon oxide layer doped with nitrogen so as not to inhibit subsequent silicidation;
forming a titanium layer on the nitrogen-doped silicon oxide layer;
annealing the titanium layer to form a titanium silicide conductor layer and a silicon nitride layer having a thickness of a few atomic layers interposed between the bottom silicon layer and the refractory metal silicide conductor layer, wherein annealing the titanium layer to form the silicon nitride layer includes annealing the titanium layer to form the silicon nitride layer having a low nitrogen concentration of approximately 5.4 percent by volume of nitrogen atoms;
forming a cap dielectric over the titanium silicide conductor layer;
etching each layer to define a word line stack; and
forming spacers alongside the word line stack.

70. The method of claim 69, wherein annealing the silicon oxide layer in a nitrogen-containing ambient includes selecting the nitrogen-containing ambient from at least one material selected from the group consisting of $N_2O$, NO and $NH_3$.

71. The method of claim 69, wherein annealing the titanium layer to form the silicon nitride layer includes annealing the titanium layer to form the silicon nitride layer having a thickness of approximately less than 20 to 50 angstroms.

72. A method of forming a semiconductor memory device, comprising:
forming a plurality of memory cells;
coupling a plurality of access transistors to the plurality of memory cells; and
coupling at least one word line over a gate oxide layer to the plurality of access transistors by a method comprising:
forming a bottom silicon layer over the gate oxide layer;
forming a nitrogen-doped silicon oxide layer over the bottom silicon layer;
forming a titanium layer on the nitrogen-doped silicon oxide layer;
forming a titanium nitride cap over the titanium layer; and
annealing the titanium layer, after forming the titanium nitride cap, to form a titanium silicide conductor layer and a silicon nitride layer having a thickness of a few atomic layers from the nitrogen-doped silicon oxide layer and the titanium layer, wherein annealing the titanium layer to form the silicon nitride layer includes annealing the titanium layer to form the silicon nitride layer having a low nitrogen concentration of approximately 1.4 percent by volume of nitrogen atoms interposed between the bottom silicon layer and the titanium silicide conductor layer.

73. The method of claim 72, wherein forming the bottom silicon layer comprises selecting a material selected from the group consisting of intrinsic silicon, intrinsic polysilicon, doped silicon, and doped polysilicon.

74. The method of claim 72, wherein annealing the titanium layer to form the titanium silicide conductor layer concurrently forms the silicon nitride layer interposed between the bottom silicon layer and the titanium silicide conductor layer.

75. A method of forming a semiconductor memory device, comprising:
forming a plurality of memory cells;
coupling a plurality of access transistors to the plurality of memory cells; and
coupling at least one word line formed over a gate oxide layer to the plurality of access transistors by a method comprising:
forming a bottom silicon layer over the gate oxide layer;
forming a nitrogen-doped silicon oxide layer over the bottom silicon layer;
forming a titanium layer on the nitrogen-doped silicon oxide layer;
forming a titanium nitride cap over the titanium layer; and
annealing the titanium layer, after forming the titanium nitride cap, to form a titanium silicide conductor layer and a thin, silicon nitride layer having a thickness of a few atomic layers from the nitrogen-doped silicon oxide layer and the titanium layer, wherein annealing the titanium layer to form the silicon nitride layer includes annealing the titanium layer to form the silicon nitride layer having a low nitrogen concentration of approximately 5.4 percent by volume of nitrogen atoms interposed between the bottom silicon layer and the titanium silicide conductor layer.

76. The method of claim 75, wherein forming the bottom silicon layer comprises selecting a material selected from the group consisting of intrinsic silicon, intrinsic polysilicon, doped silicon, and doped polysilicon.

77. The method of claim 75, wherein annealing the titanium layer to form the titanium silicide conductor layer concurrently forms the silicon nitride layer interposed between the bottom silicon layer and the titanium silicide conductor layer.

78. A method of forming a semiconductor memory device, comprising:
forming a plurality of memory cells;
coupling a plurality of access transistors to the plurality of memory cells;
coupling at least one word line to the plurality of access transistors, wherein the at least one word line comprises:
coupling a bottom silicon layer to a gate oxide layer;
coupling a thin, nitride layer to the bottom silicon layer; and
coupling a refractory metal silicide layer produced from a reaction of the refractory metal layer and a nitrogen-doped silicon oxide layer to the nitride layer having a low nitrogen concentration of approximately 1.4 percent by volume of nitrogen atoms, wherein coupling the refractory metal silicide layer to the nitride layer includes coupling the refractory metal silicide layer to the nitride layer having a residual of the nitrogen-doped silicon oxide layer after the reaction with the refractory metal layer, and wherein coupling the refractory metal silicide layer to the nitride layer includes coupling the refractory metal silicide layer to the nitride layer having a thickness of a few atomic layers and increases resistance of the at least one word line by a factor of not more than two.

79. The method of claim 78, wherein coupling the bottom silicon layer comprises selecting a material selected from the group consisting of intrinsic silicon, intrinsic polysilicon, doped silicon, and doped polysilicon.

80. The method of claim 78, wherein coupling the refractory metal silicide layer to the nitride layer includes coupling the refractory metal silicide layer to the nitride layer having a thickness of approximately less than 20 to 50 angstroms.

81. A method of forming a semiconductor memory device, comprising:

forming a plurality of memory cells;

coupling a plurality of access transistors to the plurality of memory cells;

coupling at least one word line to the plurality of access transistors, wherein the at least one word line comprises:

coupling a bottom silicon layer to a gate oxide layer;

coupling a thin, nitride layer to the bottom silicon layer; and coupling a refractory metal silicide layer produced from a reaction of a refractory metal layer and a nitrogen-doped silicon oxide layer to the nitride layer having a low nitrogen concentration of approximately 5.4 percent by volume of nitrogen atoms, wherein coupling the refractory metal silicide layer to the nitride layer includes coupling the refractory metal silicide layer to the nitride layer that is a residual of the nitrogen-doped silicon oxide layer after the reaction with the refractory metal layer, and wherein coupling the refractory metal silicide layer to the nitride layer includes coupling the refractory metal silicide layer to the nitride layer having a thickness of a few atomic layers and increases resistance of the at least one word line by a factor of not more than two.

82. The method of claim 81, wherein coupling the bottom silicon layer comprises selecting a material selected from the group consisting of intrinsic silicon, intrinsic polysilicon, doped silicon, and doped polysilicon.

83. The method of claim 81, wherein coupling the refractory metal silicide layer to the nitride layer includes coupling the refractory metal silicide layer to the nitride layer having a thickness of approximately less than 20 to 50 angstroms.

84. A method of forming a semiconductor memory device, comprising:

forming a plurality of memory cells;

coupling a plurality of access transistors to the plurality of memory cells;

coupling at least one word line to the plurality of access transistors, wherein the at least one word line comprises:

coupling a bottom silicon layer to a gate oxide layer; and forming a refractory metal silicide layer produced from a reaction of a refractory metal layer and a nitrogen-doped silicon oxide layer; and interposing a silicon nitride layer having a low nitrogen concentration of approximately 1.4 percent by volume of nitrogen atoms between the refractory metal silicide layer and the bottom silicon layer, wherein interposing the silicon nitride layer includes interposing the silicon nitride layer having a residual of the nitrogen-doped silicon oxide layer after the reaction with the refractory metal layer, and wherein interposing the silicon nitride layer includes interposing the silicon nitride layer having a thickness of a few atomic layers and increases resistance of the at least one word line by a factor of not more than two.

85. The method of claim 84, wherein coupling the bottom silicon layer comprises selecting a material selected from the group consisting of intrinsic silicon, intrinsic polysilicon, doped silicon, and doped polysilicon.

86. The method of claim 84, wherein interposing the silicon nitride layer includes interposing the silicon nitride layer having a thickness of approximately less than 20 to 50 angstroms.

87. A method of forming a semiconductor memory device, comprising:

forming a plurality of memory cells;

coupling a plurality of access transistors to the plurality of memory cells;

coupling at least one word line to the plurality of access transistors, wherein the at least one word line comprises:

coupling a bottom silicon layer to a gate oxide layer; and forming a refractory metal silicide layer produced from a reaction of a refractory metal layer and a nitrogen-doped silicon oxide layer; and interposing a silicon nitride layer having a low nitrogen concentration of approximately 5.4 percent by volume of nitrogen atoms between the refractory metal silicide layer and the bottom silicon layer, wherein interposing the silicon nitride layer includes interposing the silicon nitride layer having a thickness of a few atomic layers and increases resistance of the at least one word line by a factor of not more than two, and wherein interposing the silicon nitride layer includes interposing the silicon nitride layer having a residual of the nitrogen-doped silicon oxide layer after the reaction with the refractory metal layer.

88. The method of claim 87, wherein coupling the bottom silicon layer comprises selecting a material selected from the group consisting of intrinsic silicon, intrinsic polysilicon, doped silicon, and doped polysilicon.

89. The method of claim 87, wherein interposing the silicon nitride layer includes interposing the silicon nitride layer having a thickness of approximately less than 20 to 50 angstroms.

90. A method of forming a semiconductor transistor structure, comprising:

forming a substrate;

coupling a gate oxide layer to the substrate;

coupling a bottom silicon layer to the gate oxide layer;

coupling a silicon nitride layer to the bottom silicon layer; and coupling a refractory metal silicide layer produced from a reaction of a refractory metal layer and a nitrogen-doped silicon oxide layer to the silicon nitride layer having a low nitrogen concentration of approximately 1.4 percent by volume of nitrogen atoms, wherein coupling the refractory metal silicide layer to the silicon nitride layer includes coupling the refractory metal silicide layer to the silicon nitride layer having a residual of the nitrogen-doped silicon oxide layer after the reaction with the refractory metal layer, and wherein coupling the refractory metal silicide layer to the silicon nitride layer includes coupling the refractory metal silicide layer to the silicon nitride layer having a thickness of a few atomic layers and increases a resistance of the structure by a factor of not more than two.

91. The method of claim 90, wherein coupling the bottom silicon comprises selecting a material selected from the group consisting of intrinsic silicon, intrinsic polysilicon, doped silicon, and doped polysilicon.

92. The method of claim 90, coupling the refractory metal silicide layer to the silicon nitride layer includes coupling the refractory metal silicide layer to the silicon nitride layer having a thickness of approximately less than 20 to 50 angstroms.

93. A method of forming a semiconductor transistor structure, comprising:
forming a substrate;
coupling a gate oxide layer to the substrate;
coupling a bottom silicon layer to the gate oxide layer;
coupling a silicon nitride layer to the bottom silicon layer; and
coupling a refractory metal silicide layer produced from a reaction of a refractory metal layer and a nitrogen-doped silicon oxide layer to the silicon nitride layer having a low nitrogen concentration of approximately 5.4 percent by volume of nitrogen atoms, wherein coupling the refractory metal silicide layer to the silicon nitride layer includes coupling the refractory metal silicide layer to the silicon nitride layer having a residual of the nitrogen-doped silicon oxide layer after the reaction with the refractory metal layer, and wherein coupling the refractory metal silicide layer to the silicon nitride layer includes coupling the refractory metal silicide layer to the silicon nitride layer having a thickness of a few atomic layers and increases a resistance of the structure by a factor of not more than two.

94. The method of claim 93, wherein coupling the bottom silicon layer comprises selecting a material selected from the group consisting of intrinsic silicon, intrinsic polysilicon, doped silicon, and doped polysilicon.

95. The method of claim 93, wherein coupling the refractory metal silicide layer to the silicon nitride layer includes coupling the refractory metal silicide layer to the silicon nitride layer having a thickness of approximately less than 20 to 50 angstroms.

96. A method of forming a semiconductor transistor structure, comprising:
forming a substrate;
coupling a gate oxide layer to the substrate;
coupling a bottom silicon layer to the gate oxide layer;
coupling a nitride layer to the bottom silicon layer;
coupling a refractory metal silicide layer produced from a reaction of a refractory metal layer and a nitrogen-doped silicon oxide layer to the nitride layer having a low nitrogen concentration of approximately 1.4 percent by volume of nitrogen atoms, wherein coupling the refractory metal silicide layer to the nitride layer includes coupling the refractory metal silicide layer to the nitride layer having a residual of the nitrogen-doped silicon oxide layer after the reaction with the refractory metal layer, and wherein coupling the refractory metal silicide layer to the nitride layer includes coupling the refractory metal silicide layer to the nitride layer having a thickness of a few atomic layers and increases a resistance of the structure by a factor of not more than two;
coupling a dielectric layer to the refractory metal silicide layer; stacking the gate oxide layer, the bottom silicon layer, the nitride layer, the refractory metal silicide layer and the dielectric layer;
coupling at least one oxide spacer alongside the stack; and
forming two source/drain regions in the substrate and adjacent the at least one oxide spacer.

97. The method of claim 96, wherein coupling the bottom silicon layer comprises selecting a material selected from the group consisting of intrinsic silicon, intrinsic polysilicon, doped silicon, and doped polysilicon.

98. The method of claim 96, wherein coupling the refractory metal silicide layer to the nitride layer includes coupling the refractory metal silicide layer to the nitride layer having a thickness of approximately less than 20 to 50 angstroms.

99. A method of forming a semiconductor transistor structure, comprising:
forming a substrate;
coupling a gate oxide layer to the substrate;
coupling a bottom silicon layer to the gate oxide layer;
coupling a nitride layer to the bottom silicon layer;
coupling a refractory metal silicide layer produced from a reaction of a refractory metal layer and a nitrogen-doped silicon oxide layer to the nitride layer having a low nitrogen concentration of approximately 5.4 percent by volume of nitrogen atoms, wherein coupling the refractory metal silicide layer to the nitride layer includes coupling the refractory metal silicide layer to the nitride layer having a residual of the nitrogen-doped silicon oxide layer after the reaction with the refractory metal layer, and wherein coupling the refractory metal silicide layer to the nitride layer includes coupling the refractory metal silicide layer to the nitride layer having a thickness of a few atomic layers and increases a resistance of the structure by a factor of not more than two;
coupling a dielectric layer to the refractory metal silicide layer; stacking the gate oxide layer, the bottom silicon layer, the nitride layer, the refractory metal silicide layer and the dielectric layer;
coupling at least one oxide spacer alongside the stack; and
forming two source/drain regions in the substrate and adjacent the at least one oxide spacer.

100. The method of claim 99, wherein coupling the bottom silicon layer comprises selecting a material selected from the group consisting of intrinsic silicon, intrinsic polysilicon, doped silicon, and doped polysilicon.

101. The method of claim 99, wherein coupling the refractory metal silicide layer to the nitride layer includes coupling the refractory metal silicide layer to the nitride layer having a thickness of approximately less than 20 to 50 angstroms.

102. A method of forming a semiconductor transistor structure, comprising:
forming a substrate;
coupling a gate oxide layer to the substrate;
coupling a bottom silicon layer to the gate oxide layer;
forming a refractory metal silicide layer produced from a reaction of a refractory metal layer and a nitrogen-doped silicon oxide layer; and
interposing a nitride layer having a thickness of a few atomic layers and a low nitrogen concentration of approximately 1.4 percent by volume of nitrogen atoms between the refractory metal silicide layer and the bottom silicon layer, wherein interposing the nitride layer includes interposing the nitride layer having a residual of the nitrogen-doped silicon oxide layer after the reaction with the refractory metal layer.

103. The method of claim 102, wherein coupling the bottom silicon layer comprises selecting a material selected from the group consisting of intrinsic silicon, intrinsic polysilicon, doped silicon, and doped polysilicon.

104. The method of claim 102, wherein interposing the nitride layer includes interposing the nitride layer having a thickness of approximately less than 20 to 50 angstroms.

105. A method of forming a semiconductor transistor structure, comprising:

forming a substrate;

coupling a gate oxide layer to the substrate;

coupling a bottom silicon layer to the gate oxide layer;

forming a refractory metal silicide layer produced from a reaction of a refractory metal layer and a nitrogen-doped silicon oxide layer;

interposing a silicon nitride layer having a low nitrogen concentration of approximately 1.4 percent by volume of nitrogen atoms between the refractory metal silicide layer and the bottom silicon layer, wherein interposing the silicon nitride layer includes interposing the silicon nitride layer having a residual of the nitrogen-doped silicon oxide layer after the reaction with the refractory metal layer, wherein interposing the silicon nitride layer includes interposing the silicon nitride layer having a thickness of a few atomic layers and increases a resistance of the structure by a factor of not more than two;

coupling a dielectric layer to the refractory metal silicide layer; stacking the gate oxide layer, the bottom silicon layer, the nitride layer, the refractory metal silicide layer and the dielectric layer;

coupling at least one oxide spacer alongside the stack; and forming two source/drain regions in the substrate and adjacent the at least one oxide spacer.

106. The method of claim 105, wherein coupling the bottom silicon layer comprises selecting a material selected from the group consisting of intrinsic silicon, intrinsic polysilicon, doped silicon, and doped polysilicon.

107. The method of claim 105, wherein interposing the silicon nitride layer includes interposing the silicon nitride layer having a thickness of approximately less than 20 to 50 angstroms.

108. A method of forming a semiconductor transistor structure, comprising:

forming a substrate;

coupling a gate oxide layer to the substrate;

coupling a bottom silicon layer to the gate oxide layer;

forming a refractory metal silicide layer produced from a reaction of a refractory metal layer and a nitrogen-doped silicon oxide layer;

interposing a silicon nitride layer having a low nitrogen concentration of approximately 5.4 percent by volume of nitrogen atoms between the refractory metal silicide layer and the bottom silicon layer, wherein interposing the silicon nitride layer includes interposing the silicon nitride layer having a residual of the nitrogen-doped silicon oxide layer after the reaction with the refractory metal layer, and wherein interposing the silicon nitride layer includes interposing the silicon nitride layer having a thickness of a few atomic layers and increases a resistance of the structure by a factor of not more than two;

coupling a dielectric layer to the refractory metal silicide layer; stacking the gate oxide layer, the bottom silicon layer, the nitride layer, the refractory metal silicide layer and the dielectric layer;

coupling at least one oxide spacer alongside the stack; and forming two source/drain regions in the substrate and adjacent the at least one oxide spacer.

109. The method of claim 108, wherein coupling the bottom silicon layer comprises selecting a material selected from the group consisting of intrinsic silicon, intrinsic polysilicon, doped silicon, and doped polysilicon.

110. The method of claim 108, wherein interposing the silicon nitride layer includes interposing the silicon nitride layer having a thickness of approximately less than 20 to 50 angstroms.

111. A method of forming a semiconductor structure, comprising:

forming a substrate;

coupling an oxide layer to the substrate;

coupling a bottom silicon layer to the oxide layer;

introducing a conductor layer adjacent to the bottom silicon layer; and interposing a nitride layer having a thickness of a few atomic layers and a low nitrogen concentration of approximately $10^{13}$ ions/cm$^3$ between the bottom silicon layer and the conductor layer.

112. The method of claim 111, wherein coupling the bottom silicon layer comprises selecting a material selected from the group consisting of intrinsic silicon, intrinsic polysilicon, doped silicon, and doped polysilicon.

113. The method of claim 111, wherein interposing the nitride layer includes interposing the nitride layer comprising silicon nitride.

114. The method of claim 111, wherein interposing the nitride layer includes interposing the nitride layer having a thickness of approximately less than 20 to 50 angstroms.

* * * * *